US009450048B2

(12) United States Patent
Chan et al.

(10) Patent No.: US 9,450,048 B2
(45) Date of Patent: Sep. 20, 2016

(54) SEMICONDUCTOR DEVICE AND MANUFACTURING METHOD AND OPERATING METHOD FOR THE SAME

(71) Applicant: Macronix International Co., Ltd., Hsinchu (TW)

(72) Inventors: Ching-Lin Chan, Yunlin County (TW); Chen-Yuan Lin, Taitung (TW); Cheng-Chi Lin, Yilan County (TW); Shih-Chin Lien, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 19 days.

(21) Appl. No.: 13/736,981

(22) Filed: Jan. 9, 2013

(65) Prior Publication Data

US 2014/0191792 A1 Jul. 10, 2014

(51) Int. Cl.
 *H01L 29/08* (2006.01)
 *H01L 29/78* (2006.01)
 *H01L 29/06* (2006.01)
 *H01L 29/66* (2006.01)
 *H01L 29/10* (2006.01)

(52) U.S. Cl.
 CPC ....... *H01L 29/0869* (2013.01); *H01L 29/0692* (2013.01); *H01L 29/0865* (2013.01); *H01L 29/1095* (2013.01); *H01L 29/66689* (2013.01); *H01L 29/7816* (2013.01); *H01L 29/0634* (2013.01); *H01L 29/7823* (2013.01)

(58) Field of Classification Search
 CPC ........... H01L 27/0928; H01L 29/7827; H01L 27/11517; H01L 29/1033
 USPC .................................................. 257/216–219
 See application file for complete search history.

(56) References Cited

U.S. PATENT DOCUMENTS

| 5,719,422 A * | 2/1998 | Burr et al. ..................... 257/336 |
| 6,703,670 B1 * | 3/2004 | Lines .............. H01L 21/823842 257/205 |
| 2007/0075337 A1* | 4/2007 | Jung ................. H01L 27/14603 257/215 |
| 2009/0230500 A1* | 9/2009 | Yoshikawa ......... H01L 27/0255 257/470 |

(Continued)

FOREIGN PATENT DOCUMENTS

TW    200741892 A    11/2007

OTHER PUBLICATIONS

TW Office Action dated Jan. 20, 2015 in corresponding Taiwan application (No. 102100636).

*Primary Examiner* — Marc Armand
*Assistant Examiner* — Quinton Brasfield
(74) *Attorney, Agent, or Firm* — McClure, Qualey & Rodack, LLP

(57) ABSTRACT

A semiconductor device and a manufacturing method and an operating method for the same are provided. The semiconductor device comprises a substrate, a deep well, a first well, a first doped electrode region, a second doped electrode region and a high voltage threshold voltage channel region. The substrate has a first type conductivity. The deep well is formed in the substrate and has a second type conductivity opposite to the first conductivity. The first well is formed in the deep well and has at least one of the first type conductivity and the second type conductivity. The first and the second doped electrode regions are formed in the first well. The second doped electrode is adjacent to the first doped electrode and has the second conductivity. The high voltage threshold voltage channel region is formed in the first well and extending down from the surface of the substrate.

9 Claims, 13 Drawing Sheets

(56) References Cited

U.S. PATENT DOCUMENTS

2010/0140702 A1* 6/2010 Park ................... H01L 29/7838
257/343

2012/0153388 A1* 6/2012 Sayama .......... H01L 21/823814
257/337

2012/0319189 A1* 12/2012 Wang .................. H01L 27/0251
257/328

* cited by examiner

SEMICONDUCTOR DEVICE AND MANUFACTURING METHOD AND OPERATING METHOD FOR THE SAME

BACKGROUND

1. Technical Field

The disclosure relates in general to a semiconductor device and a method for manufacturing and operating the same, and more particularly to a depletion metal-oxide-semiconductor device and method for manufacturing and operating the same.

2. Description of the Related Art

The depletion metal oxide semiconductor has one character: when the voltage from gate to source is zero, a channel exists and it provides a output current. However, the current of the conventional depletion MOS is constant, it can't be scalable on the same device area and process. Therefore, the depletion MOS can't be applied for different circuit.

SUMMARY

The disclosure is directed to a semiconductor device and a method for manufacturing and operating the same. The output current of the semiconductor could be scale base on demand.

According to one embodiment, a semiconductor device is provided. A semiconductor device comprises a substrate, a deep well, a first well, a first doped electrode region, a second doped electrode region and a high voltage threshold voltage channel region. The substrate has a first type conductivity. The deep well is formed in the substrate and has a second type conductivity opposite to the first conductivity. The first well is formed in the deep well and has at least one of the first type conductivity and the second type conductivity. The first doped electrode region and the second doped electrode regions are formed in the first well. The first doped electrode region has the first type conductivity. The second doped electrode is adjacent to the first doped electrode and has the second type conductivity. high voltage threshold voltage channel region is formed in the first well, extends down from a surface of the substrate, covers parts of a surface of the second doped electrode and has the second type conductivity. A surface of high voltage threshold voltage channel having a first side, a second side opposite to the first side, a third side and the fourth side opposite to the third side, the first side and the second side are adjoined to the third side and the fourth side.

According to another embodiment, a method for manufacturing semiconductor device is provided. First, a substrate having a first type conductivity is provided. A deep well having a second type conductivity opposite to the first type conductivity is formed in the substrate and extending down from a surface of the substrate. A first well having at least one of the first type conductivity and the second type conductivity is formed in the deep well and extending down from the surface of the substrate. A high voltage threshold voltage channel region having the second type conductivity is formed in the first well and extending down from the surface of the substrate. A first doped electrode region having the first type conductivity is formed in the deep well wherein the first doped electrode region is in a region without high voltage threshold voltage channel region in the first well. A second doped electrode region having the second type conductivity is formed in the deep well. The second doped electrode region is adjacent to the first doped electrode region, and parts of the second doped electrode region are covered by high voltage threshold voltage channel region. An output current of the semiconductor device is scaled according to a ratio that the high voltage threshold voltage channel region covered by the second doped electrode region.

According to an alternative embodiment, a method for operating semiconductor device is provided. The semiconductor device comprises a substrate, a deep well, a first well, a first doped electrode region, a second doped electrode region, a third doped electrode region and a high voltage threshold voltage channel region. The substrate has a first type conductivity. The deep well is formed in the substrate and has a second type conductivity opposite to the first type conductivity. The first well is formed in the deep well and has at least one of the first type conductivity and the second type conductivity. The first doped electrode region is formed in the first well and has the first type conductivity. The second doped electrode region is formed in the first well, adjacent to the first doped electrode region and has the second type conductivity. The third doped electrode region is formed within the deep well, extending down from a surface of the substrate, spaced apart from the second doped electrode region with a distance and has the second conductive type. The high voltage threshold voltage channel region is formed in the first well, extends down from the surface of the substrate, covers parts of a surface of the second doped electrode and has the second type conductivity. The surface of the high voltage threshold voltage channel has a first side, a second side opposite to the first side, a third side and the fourth side opposite to the third side, the first side and the second side are adjoined to the third side and the fourth side. The operating method for the semiconductor device comprises following steps: a voltage is applied to the gate structure. The first doped electrode region is coupled to a first electrode. The first electrode is one of an anode and a cathode. The third doped electrode region is coupled to a second electrode. The second electrode is another of the anode and the cathode.

The above and other aspects of the disclosure will become better understood with regard to the following detailed description of the non-limiting embodiment(s). The following description is made with reference to the accompanying drawings.

Figure 1A:
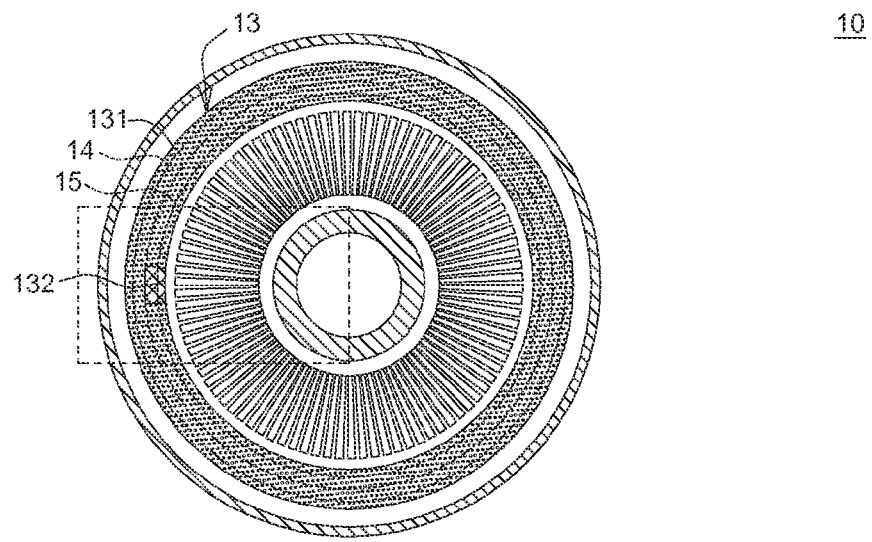
FIG. 1A illustrates top views of a semiconductor device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
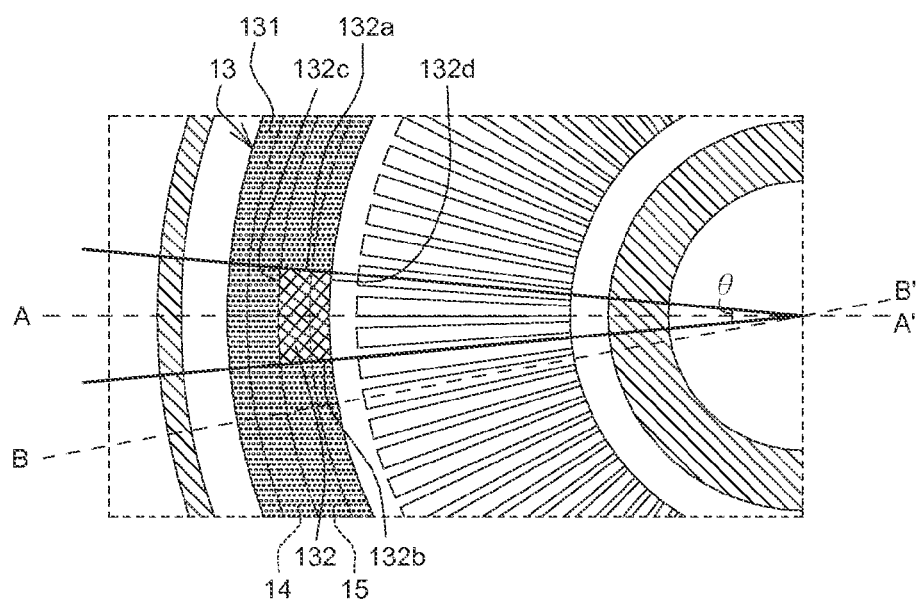
FIG. 1B is a partial enlarging drawing of FIG. 1A.

FIG. 1A illustrates top views of a semiconductor device according to one embodiment. FIG. 1B illustrates an enlarged view of a portion, indicated by a dotted line, of the semiconductor device shown in FIG. 1A. In one embodiment, the semiconductor structure 10 comprises a first well 13 formed in a deep well of a substrate. The first well 13 includes two adjacent doped electrode regions, that is, a first doped electrode region 14 and a second doped electrode region 15. A high voltage threshold voltage channel region 132 has a first side 132a, a second side 132b opposite to the first side, a third side 132c and a fourth side 132d opposite to the third side. The first side 132a and the second side 132b are adjoined to the third side 132c and the fourth side 132d, which forms a closed area. The high voltage threshold voltage channel region 132 covers parts of the second doped electrode region 15. In this embodiment, a semiconductor device with the annular electrodes formed on the substrate. The invention is not limited to the annular electrodes, and other shapes (viewed from top) of electrodes could be constructed. For example, partial electrodes could be plural strips arranged in parallel.

In embodiments, the substrate 11 and the first doped electrode region 14 have a first type conductivity such as P type conductivity, while the deep well 12, the second doped electrode region 15 and the high threshold voltage region 132 have a second type conductivity such as N type conductivity, opposite to the first type conductivity. And vice versa. The deep well 12 could have at least one of the first type conductivity and the second type conductivity.

Figure 2:
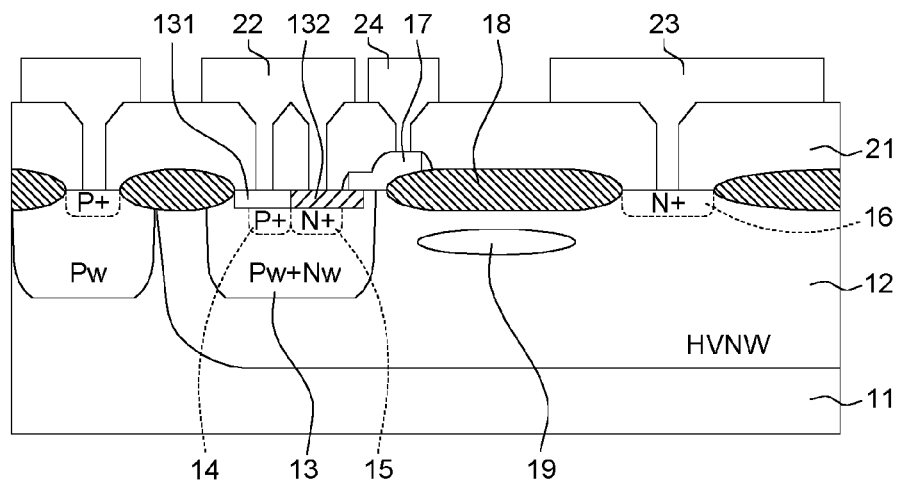
FIG. 2 is a cross-sectional view along the cross-sectional line A-A' of FIG. 1B.
Figure 3:
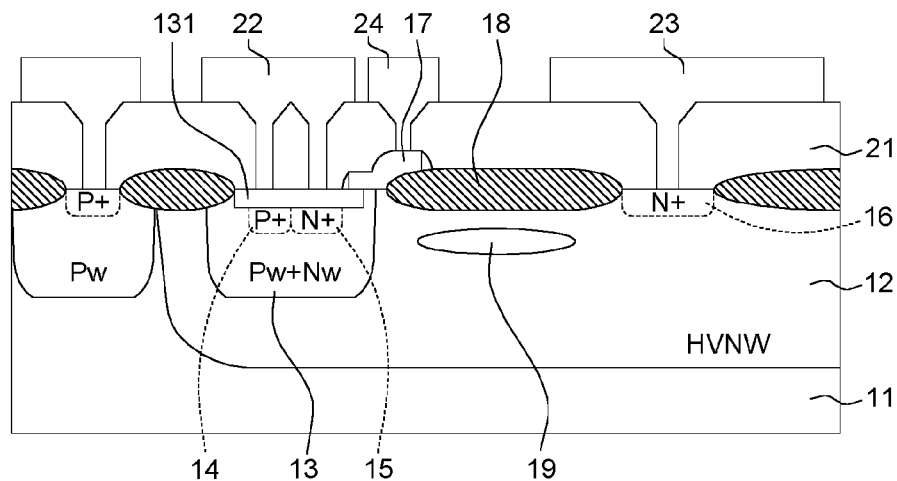
FIG. 3 is a cross-sectional view along the cross-sectional line B-B' of FIG. 1B

Please refer to FIG. 2 and FIG. 3 for illustrations of the embodiment. FIG. 2 is a cross-sectional view along the cross-sectional line A-A' of FIG. 1B, and FIG. 3 is a cross-sectional view along the cross-sectional line B-B' of FIG. 1B. The difference between FIGS. 2 and 3 is the existence of the high voltage threshold voltage channel region 132.

Specifically, the first doped electrode 14 and the second doped electrode 15 is adjacently disposed in the first well. In the structure of FIG. 2, the high voltage threshold voltage channel region 132 is extending down from a surface of the substrate 11 and covering parts of a surface of the second doped electrode 15. In addition, a field layer 131 is also extend down from the surface of the substrate 11, and covering parts of a surface of the first doped electrode 14. The field layer has a first type conductivity. On the other hand, there is no high voltage threshold voltage channel region in the structure of FIG. 3. The field layer 131 covers the surface of the first doped electrode 14 and the second doped electrode 15. That is, the high voltage threshold voltage channel region 132 covers parts of the second doped electrode region 15, and the field layer 131 cover the other parts of the second doped electrode region 15 and all the first doped electrode region 14.

As shown in FIG. 2 and FIG. 3, the semiconductor device 10 comprises a third doped electrode region 16, a top doped region 19, the dielectric 18 and a gate structure 17, wherein the top doped region 19 has the first type conductivity and the third doped electrode region 16 has the second type conductivity. The third doped electrode region 16 is formed within the deep well 12 and spaced apart from the second doped electrode region 15 with a distance. The dielectric 18 is formed on the substrate 11 and positioned between the second doped electrode region 15 and the third doped electrode region 16. The dielectric 18 could be a field oxide (FOX). The top doped region 19 is formed in the deep well 12 and positioned beneath the dielectric 18. The gate structure 17 is disposed on the high voltage threshold voltage channel region and the dielectric.

As shown in FIG. 2 and FIG. 3, the semiconductor device 10 further comprises an inter-layered dielectric (ILD) 21 formed on the surface of the substrate 11 and exposing partial surfaces of the field layer 131, the third doped electrode region 16 and the gate structure 17. The semiconductor device 10 further comprises a first electrode 22, a second electrode 23 and a third electrode 24 formed on the ILD 21 and contacting said exposed partial surfaces of the field layer 131, the third doped electrode region 16 and the gate structure 17, respectively. In embodiment, the first electrode 22 is electrically connected to the first doped electrode region 14 and the second doped electrode region 15. The second electrode 23 is electrically connected to the third doped electrode region 16. The third electrode 24 is electrically connected to the gate structure 17. In one embodiment, the semiconductor device is a depletion MOS device. The three electrodes could be used as the anode (source), cathode (drain) or gate of the depletion MOS device.

Figure 4A:
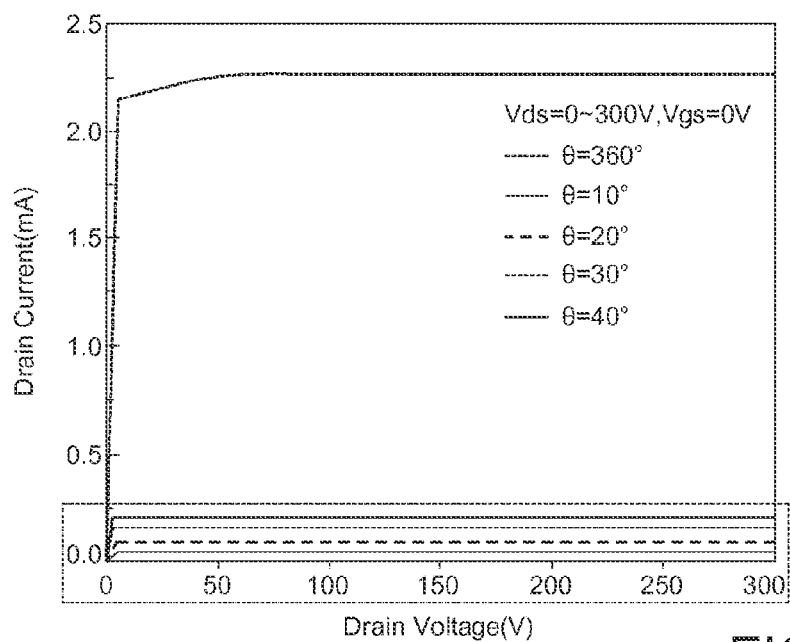
FIG. 4A is relationship between the drain current and the drain voltage at different covered angle of the high voltage threshold voltage channel region.
Figure 4B:
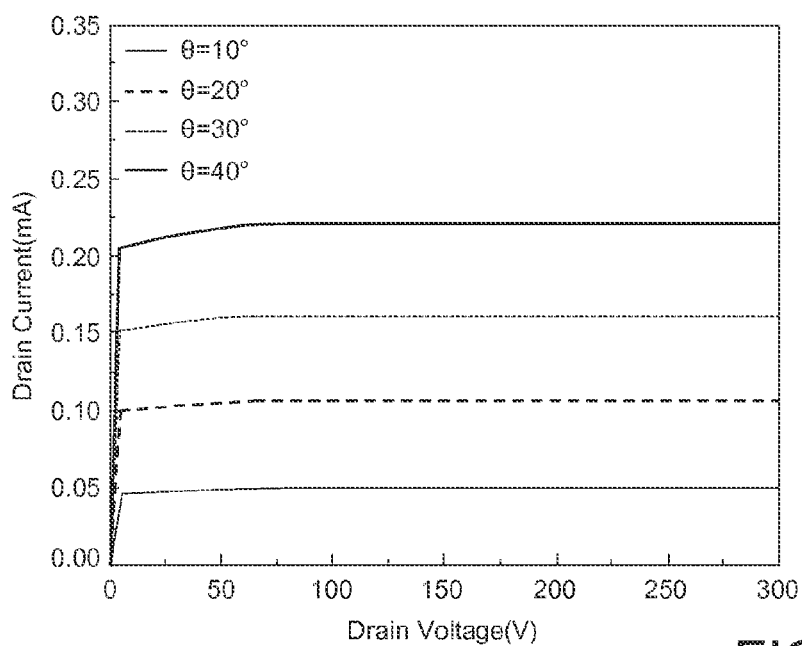
FIG. 4B is a partial enlarging drawing of FIG. 4A.

In one embodiment, an output current provided by the semiconductor device 10 can be controlled by adjusting an area of the second doped electrode region 15 covered by the high voltage threshold voltage channel region 132. For example, please referring to FIG. 4A and FIG. 4B, which illustrating relationship between the drain current and the drain voltage at different covered angle of the high voltage threshold voltage channel region. The measurement results show that the higher covered angle $\theta$ is, which means an area of the second doped electrode region covered by the high voltage threshold voltage channel region is higher, the high drain current (output current) of the semiconductor device 10 is. When $\theta=360°$, which means the high voltage threshold voltage channel region 132 covers all the annular second doped electrode region, the drain current is maximum.

Figure 5A:
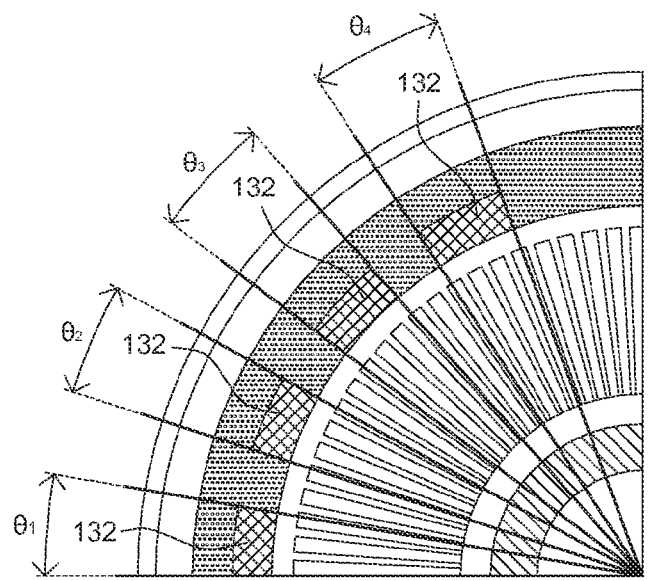
FIG. 5A is a partial enlarging top view of another semiconductor device according to the embodiment of the disclosure.
Figure 5B:
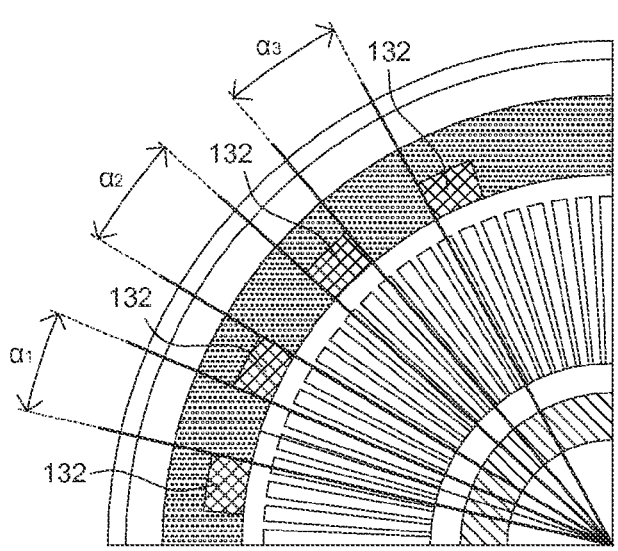
FIG. 5B is an alternative enlarging top view of another semiconductor device according to the embodiment of the disclosure.

In one embodiment, as shown in FIG. 5A, there could be 2 or more high voltage threshold voltage channel regions 132 in the semiconductor device 10. The size of each high voltage threshold voltage channel regions 132 may be different. The intensity of output current is decided by the total area of the second doped electrode region 15 covered by the high voltage threshold voltage channel region 132, such as $\theta_1+\theta_2+\theta_3+\theta_4\ldots$. In this embodiment, the covered angle $\theta$ of each high voltage threshold voltage channel regions is different, wherein $\theta_1<\theta_2<\theta_3<\theta_4$. In other embodiment, the spaced angle $\alpha$ between each of the high voltage threshold voltage channel regions is different, as shown in FIG. 5B, wherein $\alpha_1<\alpha_2<\alpha_3<\alpha_4$.

FIG. 6A-FIG. 14B depict a process of manufacturing the semiconductor device of the embodiment. Figures labeled with A such as FIGS. 6A, 7A, 8A, . . . 14A illustrate a cross-sectional view along the cross-sectional line A-A' of FIG. 1B, wherein the position of the cross-sectional line A-A' is corresponding to the first well 13 with the high voltage threshold voltage channel region 132. Figures labeled with B such as FIGS. 6B, 7B, 8B, . . . 14B illustrate cross-sectional view along the cross-sectional line B-B' of FIG. 1B, wherein the position of the cross-sectional line B-B' is corresponding to the first well 13 without the high voltage threshold voltage channel region 132.

Also, P type and N type are selected as the first type conductivity (i.e. conductivity of the substrate 11 and the first doped electrode region 14) and the second type conductivity (i.e. conductivity of the deep well 12 and the second doped electrode region) for marking in the drawings. However, the invention is not limited thereto.

Figure 6A:
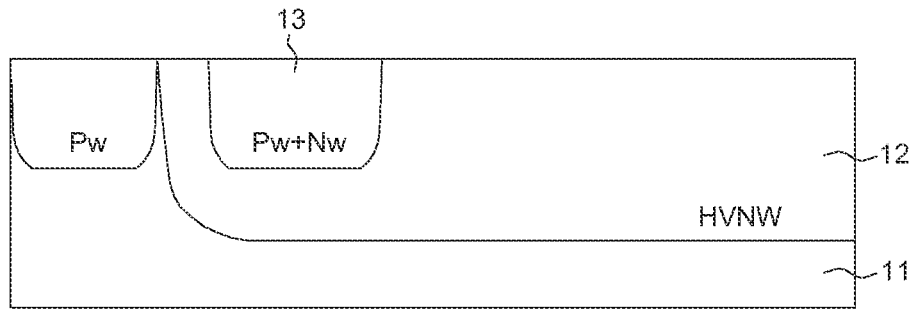
FIG. 6A-FIG. 14B depict a process of manufacturing the semiconductor device of the embodiment.
Figure 6B:
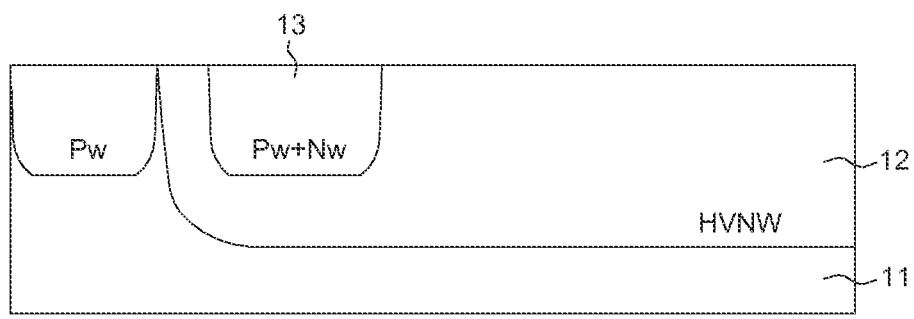

Please refer to FIG. 6A and FIG. 6B. First, a substrate 11 having a first type conductivity is provided, and a deep well 12 having a second type conductivity is formed in the substrate 11 by ion implant, and the deep well 12 extends down from the surface of the substrate 11. Next, a first well 13 is formed in the deep well 12 and extending down from the surface of the substrate 11 by ion implant. The first well 13 could have at least one of the first type conductivity and the second type conductivity and in this embodiment the first well has both conductivities. Also, other P-well (PW) could be formed outside the deep well 12.

Figure 7A:
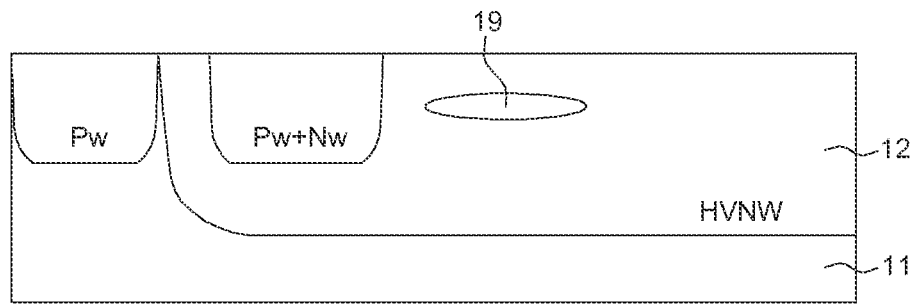
Figure 7B:
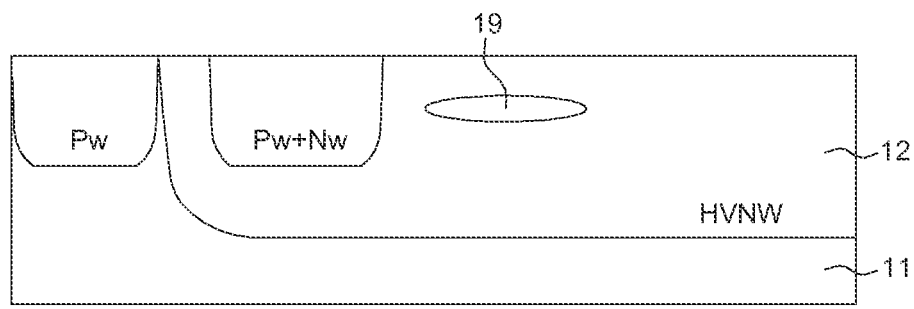

Please refer to FIG. 7A and FIG. 7B. A top doped region 19 having the first type conductivity is formed in the deep well 12 by implant.

Figure 8A:
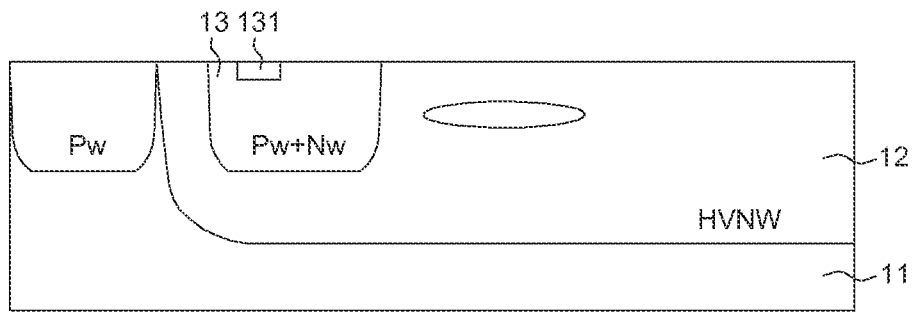
Figure 8B:
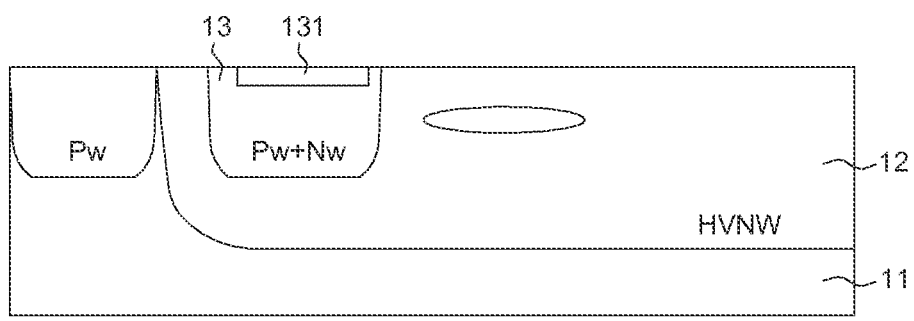

Please refer to FIG. 8A and FIG. 8B. A field layer 131 having the first type conductivity is formed in the first well 13 and extending down from the surface of the substrate 11 by ion implant. The size of the field layer 131 in FIG. 8A is smaller than it in FIG. 8B.

Figure 9A:
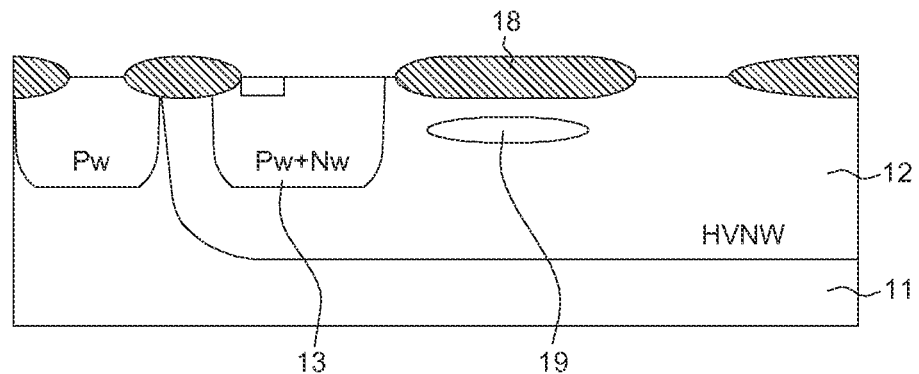
Figure 9B:
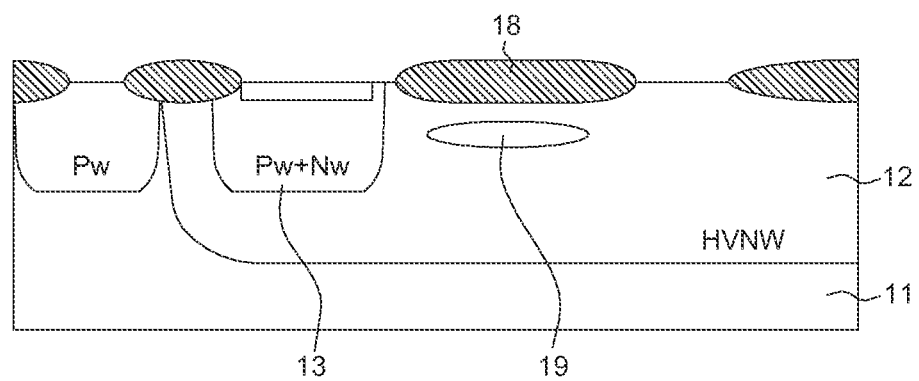

Please refer to FIG. 9A and FIG. 9B. A dielectric 18 such as filed oxide (FOX) is formed on the substrate 11 and positioned above the top doped region 19. Examples of the dielectric 18 include FOX and shallow trench isolation (STI).

Figure 10A:
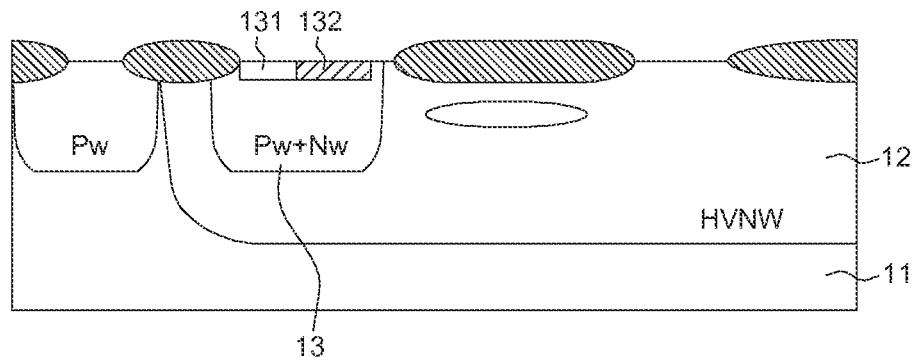
Figure 10B:
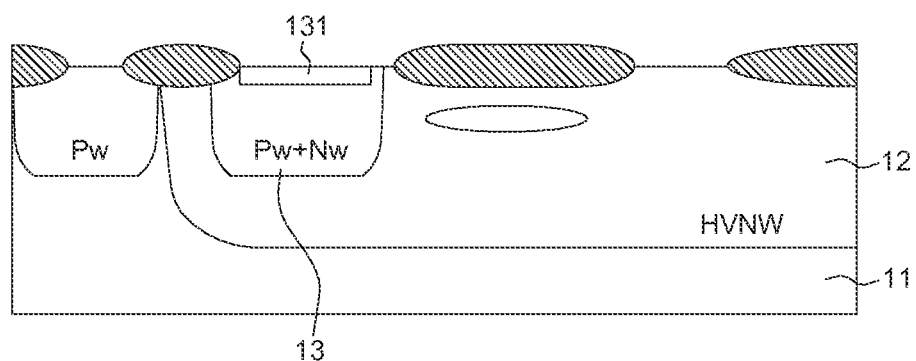

Please refer to FIG. 10A and FIG. 10B. A high threshold voltage region 132 having the second type conductivity is formed in the first well 13, adjacent to the field layer 131 and extending down from the surface of the substrate 11 by ion implant.

Figure 11A:
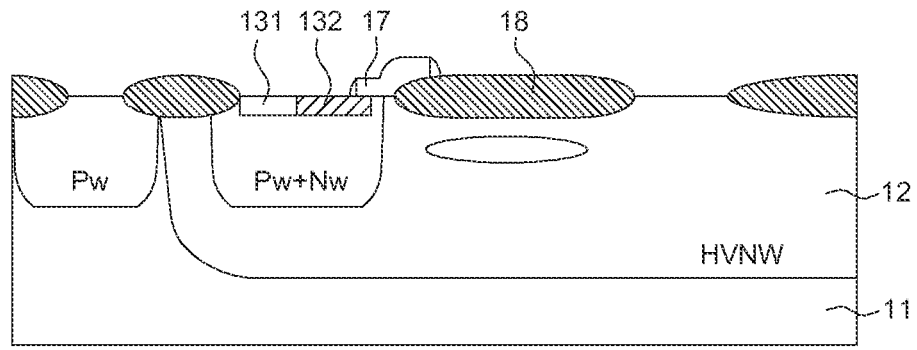
Figure 11B:
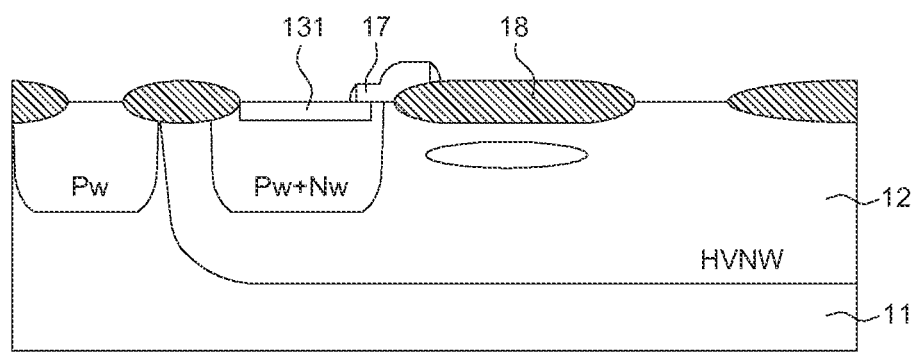

Please refer to FIG. 11A and FIG. 11B. A gate structure 170 is formed on the high threshold voltage region 132, and extended on the dielectric 18. The gate structure 17 may comprise a gate dielectric layer, a gate electrode layer and a spacer. The gate electrode layer is formed on the gate dielectric layer. The spacers are formed on opposite sidewalls of the gate dielectric layer and the gate electrode layer. In one embodiment, before forming the gate dielectric layer, a SAC oxide is formed on the surface of the substrate 104, and then the SAC oxide is removed. Therefore, the gate dielectric layer having excellent property can be formed. The gate electrode layer may comprise a polysilicon layer and a metal silicide layer, such as tungsten silicide, formed on the polysilicon layer. The spacer may comprise silicon dioxide such as tetraethoxy silane (TEOS).

Figure 12A:
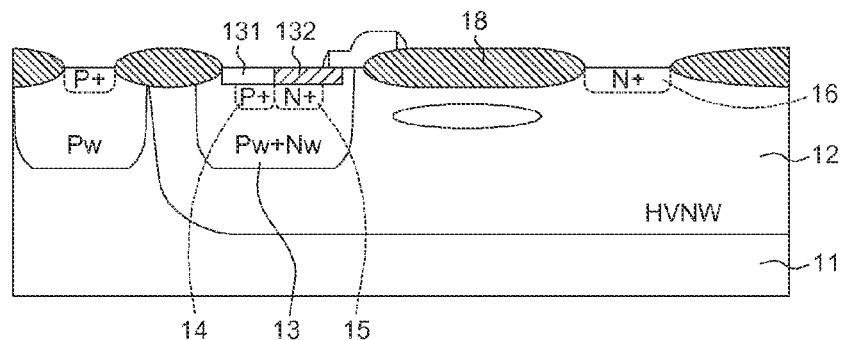
Figure 12B:
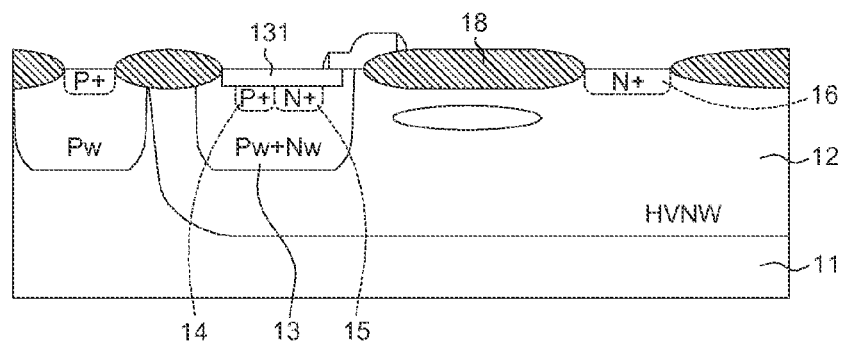

Please refer to FIG. 12A and FIG. 12B. A first doping electrode region 14 having the first type conductivity is formed in the first well 23, a second doping electrode region 15 having the second type conductivity is formed in the first well 23 and a third doping electrode region 16 having the second type conductivity is simultaneously formed in the deep well 12 by ion implant. The first doping electrode region 14 is adjacent to the second doping electrode region 15. The third doped electrode region 16 is extending down from the surface of the substrate 11, and spaced apart from the second doped electrode region 15 by dielectric 18. In FIG. 12A, the first doped electrode region 14 is formed beneath the field layer 131, and the second doped electrode region 15 is formed beneath the high voltage threshold voltage channel region 132.

Figure 13A:
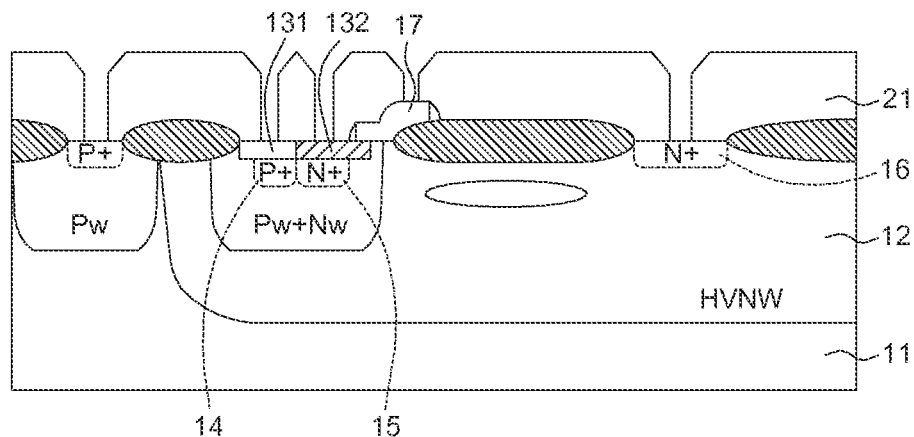
Figure 13B:
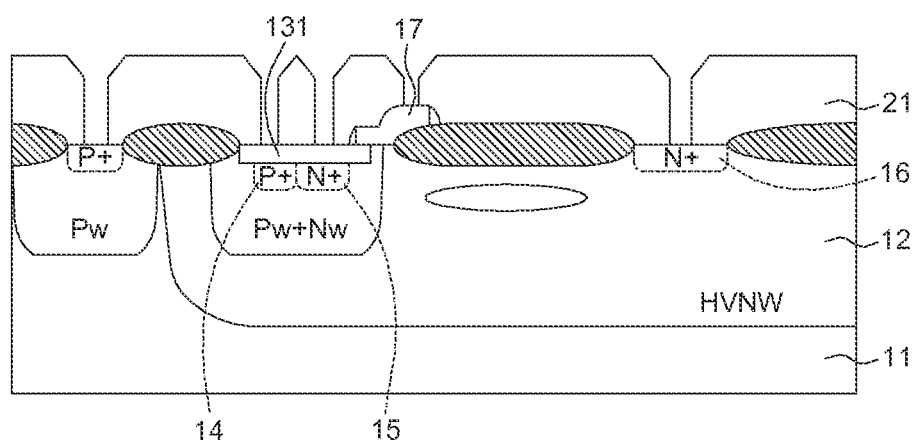

Please refer to FIG. 13A and FIG. 13B. By dielectric formation, pattern defining and etching, an inter-layered dielectric (ILD) 21 is formed on the surface of the substrate 11 and exposes partial surfaces of the field layer 131, the high voltage threshold voltage channel region 132, the third doping electrode region 16 and the gate structure 17.

Figure 14A:
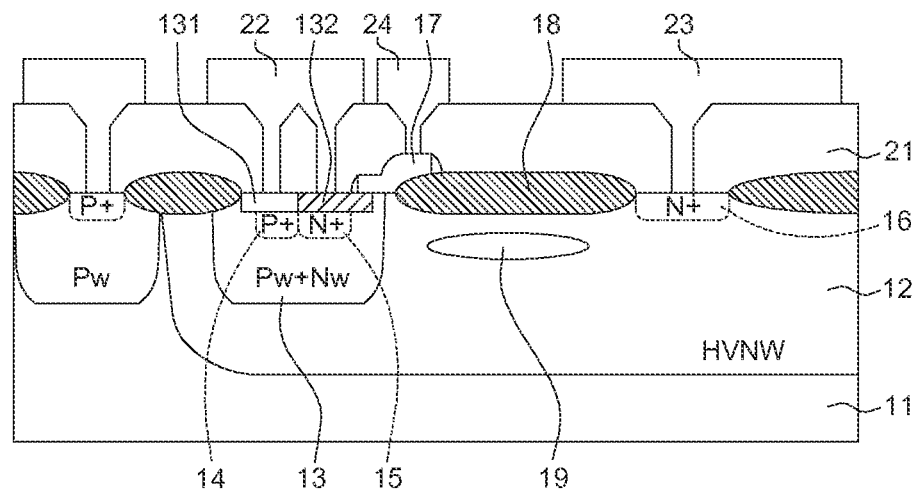
Figure 14B:
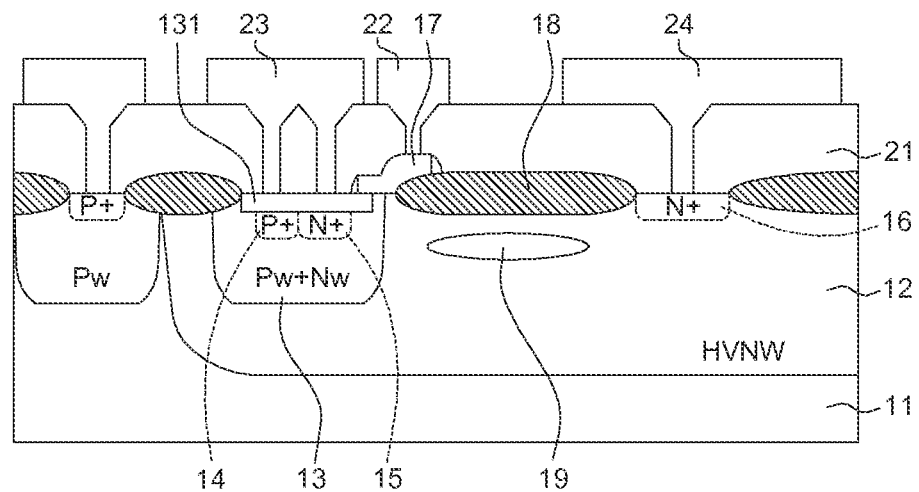

Please refer to FIG. 14A and FIG. 14B. A conductive layer is deposited on the substrate 11 and patterned by photo-define and etching, to form a first electrode 22, a second electrode 23 and a third electrode 24 on the ILD 21. The first electrode 22, the second electrode 23 and the third electrode 24, filling up the openings of the ILD 21, contact the exposed partial surfaces of the field layer 131 (first electrode 22), the high voltage threshold voltage channel region 132 (first electrode 22), the third doping electrode region 16 (second electrode 23) and the gate structure 17 (third electrode 24), respectively. The first electrode 22, the second electrode 23 and the third electrode 24 could function as source (anode), drain (cathode) and gate of the semiconductor device in the application.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor device, comprising:
   a substrate having a first type conductivity;
   a deep well formed in the substrate and having a second type conductivity opposite to the first type conductivity;
   a first well formed in the deep well, wherein the first well has at least one of the first type conductivity and the second type conductivity;
   a first doped electrode region formed in the first well and having the first type conductivity;
   a second doped electrode region having the second type conductivity, wherein the second doped electrode region is formed in the first well and adjacent to the first doped electrode region;
   a field layer formed in the first well and having the first type conductivity, wherein the field layer extends down from the surface of the substrate and covers a top surface of the first doped electrode region; and
   at least one high voltage threshold voltage channel region formed in the first well and having the second type conductivity, wherein the high voltage threshold voltage channel region extends down from a surface of the substrate, a part of the second doped electrode region is covered by the high voltage threshold voltage channel region and another part of the second doped electrode region is covered by the field layer, a surface of the high voltage threshold voltage channel region has a first side, a second side opposite to the first side, a third side and a fourth side opposite to the third side, and the first side and the second side are adjoined to the third side and the fourth side.

2. The semiconductor device according to claim 1, wherein the number of the at least one high voltage threshold voltage channel region is equal to or larger than two.

3. The semiconductor device according to claim 1, further comprising: a third doped electrode region within the deep well and having the second conductivity type, wherein the third doped electrode region extends down from the surface of the substrate and being spaced apart from the second doped electrode region with a distance.

4. The semiconductor device according to claim 3, further comprising: a dielectric formed on the substrate and positioned between the second doped electrode region and the third doped electrode region.

5. The semiconductor device according to claim 4, further comprising: a gate structure on the high voltage threshold voltage channel region and the dielectric.

6. The semiconductor device according to claim 5, wherein the gate structure is electrically connected to a voltage source, when the voltage source applies zero voltage to the gate structure, the semiconductor device provides an output current, and the higher area of the second doped electrode region covered by the high voltage threshold voltage channel region, the higher output current the semiconductor device provides.

7. The semiconductor device according to claim 5, further comprising: a top doped region having the first type conductivity, wherein the top doped region is formed in the deep well and positioned beneath the dielectric.

8. An operating method for a semiconductor device, wherein the semiconductor device comprises:
- a substrate having a first type conductivity;
- a deep well formed in the substrate and having a second type conductivity opposite to the first type conductivity;
- a first well formed in the deep well and having at least one of the first type conductivity and the second type conductivity;
- a first doped electrode region formed in the first well and having the first type conductivity;
- a second doped electrode region having the second type conductivity, wherein the second doped electrode region is formed in the first well and adjacent to the first doped electrode region;
- a third doped electrode region formed within the deep well, wherein the third doped electrode region extends down from a surface of the substrate, being spaced apart from the second doped electrode region with a distance and having the second conductivity type; and
- at least one high voltage threshold voltage channel region having the second type conductivity, extending down from the surface of the substrate and formed in the first well, wherein a part of the second doped electrode region is covered by the high voltage threshold voltage channel region and another part of the second doped electrode region is covered by a field layer, a surface of the high voltage threshold voltage channel region has a first side, a second side opposite to the first side, a third side and a fourth side opposite to the third side, and the first side and the second side are adjoined to the third side and the fourth side;

the operating method for the semiconductor device comprises: applying a voltage to a gate structure;
coupling the first doped electrode region to a first electrode, wherein the first electrode is one of an anode and a cathode; and
coupling the third doped electrode region to a second electrode, wherein the second electrode is another of the anode and the cathode.

9. The operating method for the semiconductor device according to claim 8, wherein the semiconductor device provides an output current when the voltage is zero.

* * * * *